United States Patent [19]

Onyon

[11] Patent Number: 4,807,164
[45] Date of Patent: Feb. 21, 1989

[54] APPARATUS FOR MEASURING AND CONTROLLING VELOCITY

[75] Inventor: Peter D. Onyon, Leicester, United Kingdom

[73] Assignee: Rank Taylor Hobson Limited, England

[21] Appl. No.: 940,506

[22] Filed: Dec. 11, 1986

[30] Foreign Application Priority Data

Dec. 12, 1985 [GB] United Kingdom ............... 8530577

[51] Int. Cl.$^4$ ............................................. G01P 3/42
[52] U.S. Cl. ..................................... 364/565; 356/28; 324/166; 364/582
[58] Field of Search ............... 364/565, 569, 579, 580, 364/570, 571, 582; 324/160, 163, 166, 178–180; 356/27, 28

[56] References Cited

U.S. PATENT DOCUMENTS

| | | | |
|---|---|---|---|
| 3,819,268 | 6/1974 | Johnson | 356/28 |
| 4,019,145 | 4/1977 | Rathe | 332/23 A |
| 4,166,976 | 9/1979 | Ruhnau et al. | 324/166 |
| 4,199,719 | 4/1980 | Grob | 364/565 |
| 4,323,976 | 4/1982 | Radaelli et al. | 324/160 |
| 4,449,191 | 5/1984 | Mehnert | 364/565 |
| 4,527,120 | 7/1985 | Kurosawa | 324/166 |
| 4,569,027 | 2/1986 | Nakano et al. | 324/160 |
| 4,680,721 | 7/1987 | Pluddemann | 364/565 |

FOREIGN PATENT DOCUMENTS 2044736 11/1971 Fed. Rep. of Germany .
3341173 5/1985 Fed. Rep. of Germany .
1214514 12/1970 United Kingdom .
1290090 9/1972 United Kingdom .
2904079 9/1982 United Kingdom .

Primary Examiner—Parshotam S. Lall
Assistant Examiner—Brian M. Mattson
Attorney, Agent, or Firm—Lerner, David, Littenberg, Krumholz & Mentlik

[57] ABSTRACT

Apparatus for measuring velocity utilizes quadrature input signals provided by a transducer and divides the derivative of one of the signals by the magnitude of the other to obtain a measure of velocity. The apparatus may be digital or analog. It is particularly suitable for the measurement of velocity where the quadrature signals are provided by an optical grating and transducer arrangement.

21 Claims, 4 Drawing Sheets

APPARATUS FOR MEASURING AND CONTROLLING VELOCITY

This invention relates to apparatus for the measurement of velocity and to a servo apparatus in which the velocity is controlled.

It is known to measure velocity by means of a tachometer but such devices add expense to the system, are relatively unreliable and do not operate accurately at low speeds.

Apparatus for measuring velocity is also known in which a transducer responds to the movement of the member whose velocity is to be measured and produces a signal having a frequency which is proportional to velocity. A control signal proportional to the frequency of the signal from the transducer may be derived by, for example, counting the number of cycles of the signal from the transducer in a predetermined fixed time period or measuring the period of the signal from the transducer. The resolution of such systems is relatively low and is insufficient for providing accurate control of low velocities in, for example, precision apparatus such as metrological apparatus.

UK patent specification No. 1,290,090 discloses a servo system in which an electromagnetic transducer arrangement provides output signals having frequencies proportional to velocity. These signals are differentiated and combined in a commutator to provide a DC control signal representing velocity but this includes a ripple component. With a view to eliminating the ripple, a reference signal is derived from the undifferentiated signals from the transducer and the control signal compared with this reference to provide an error signal. However, the arrangement illustrated in this patent only eliminates the ripple when the velocity error is zero. Since the ripple appears in the error signal at other times, control is inadequate for high precision applications such as the control of a rotatable workpiece support table in metrological apparatus.

The problem underlying the invention is to provide an apparatus for measuring velocity in which the above problems are solved and which is particularly suitable for measuring slow velocities with a high degree of resolution.

In order to solve these problems, the invention provides apparatus for measuring velocity of a movable member, comprising means for producing two input signals which are substantially in quadrature and have a frequency dependent upon the velocity of the member, means for providing a first value dependent upon a derivative of a first of said input signals, means for providing a second value dependent upon the magnitude of the second of the input signals, and means for dividing one of the values by the other to obtain a third value which is a function of the velocity.

Thus, extremely high resolution can be achieved with the invention since measurements of velocity can be made at any point within, or continuously within, the cycles of the input signals. This cannot be done, for example, in the prior art which relies upon counting cycles to obtain a velocity measurement. Further, the problem of ripple is avoided.

The apparatus in accordance with the invention may be digitial or analog or a combination of both.

The invention is described further by way of example with reference to the accompanying drawings in which.

FIRST EMBODIMENT

Figure 1:
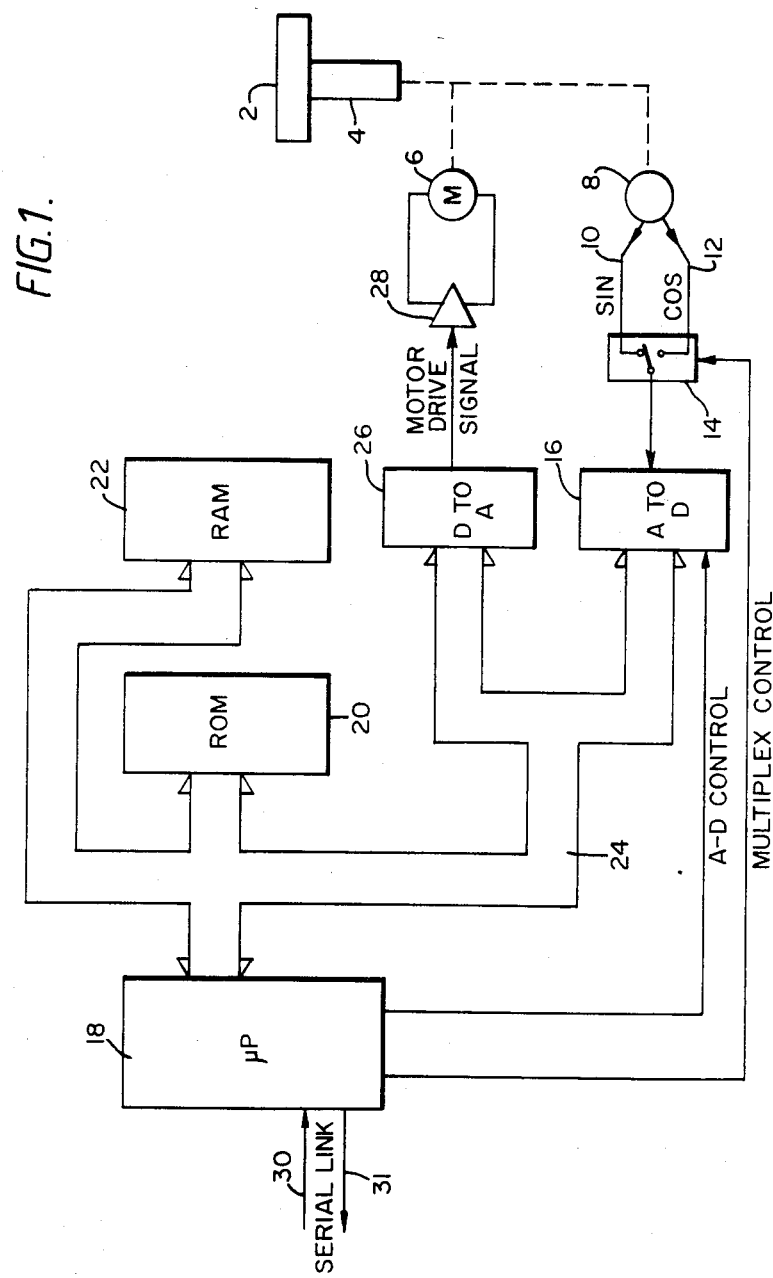
FIG. 1 is a block diagram of a servo system according to an embodiment of the invention for measuring and controlling the velocity of a rotatable spindle.

With reference to FIGS. 1 to 4, a metrological apparatus (not shown) includes a workpiece support turntable shown diagrammatically at 2 mounted on a spindle 4 which is driven by a motor 6, the linkage between the motor 6 and the shaft 4 being indicated by broken lines in FIG. 1. An optical grating and transducer arrangement 8 senses the speed of rotation of the shaft 4 and provides on outputs 10, 12 first and second alternating signals each having the same frequency, which frequency is proportional to the angular velocity of the shaft 4, and each having the same amplitude, but being in phase quadrature. Typically, the angular velocity may be from 0 to a few rpm and the frequency may be up to 1000 Hz, for example in the region of 200 Hz. The signals on outputs 10 and 12 are multiplexed through a switch 14 to analog-to-digital converter 16. A microprocessor 18 controlled by programs stored in a ROM 20 actuates the switch 14, transfers the digital signals from the A/D converter 16 in parallel form to a RAM 22 via data bus 24 and supplies, via bus 24, parallel digital velocity control signals to digital-to-analog converter 26 which converts the velocity control signals to analog form and supplies the resulting analog signal to a power amplifier 28 which controls the motor 6. The microprocessor 18 has an input 30 for receiving serial digital velocity command signals and computes the control signal to be supplied to digital-to-analog converter 26 utilizing the velocity command signal 30 and the signals supplied by analog-to-digital converter 16. An output 31 is provided to enable the processor 18 to output digital data, such as to indicate that the shaft 4 is rotating at the commanded velocity.

Figure 2:
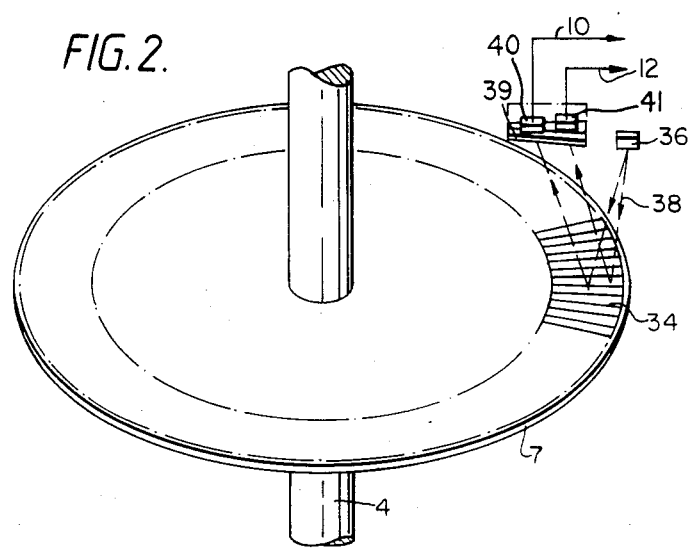
FIG. 2 is a diagrammatic view of the spindle illustrating a transducer arrangement provided thereon.

The transducer and grating arrangement 8 is shown diagrammatically in more detail in FIG. 2. As can be seen, this arrangement comprises a grating 34 made up of a multiplicity of radially extending reflective and non-reflective lines distributed at equi-angularly spaced positions around the periphery of a disc 7 which is fixed on the shaft 4. A light source 36 directs a beam of light 38 at the grating 34 and this beam is reflected from the grating 34 through an index grating 39, which is stationary and has a grating pattern which is the same as a segment of the grating 34, to first and second transducers 40, 41 positioned to produce respective ones of the aforementioned quadrature signals on outputs 10 and 12.

Figure 3:
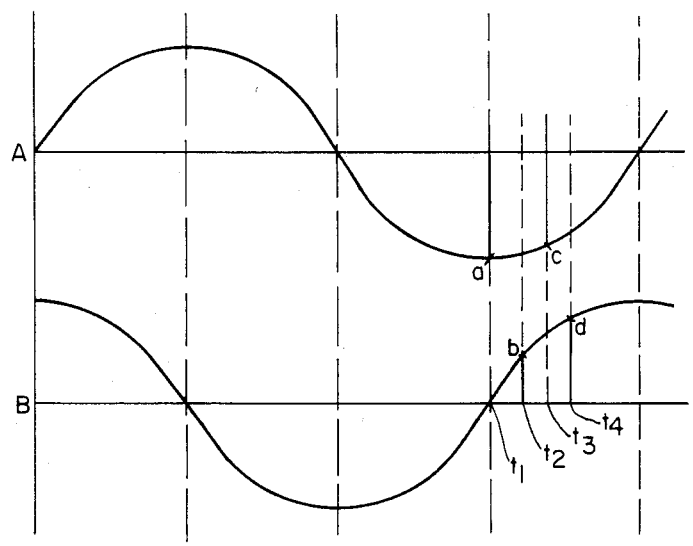
FIG. 3 is a waveform diagram for illustrating the operation of the apparatus shown in FIGS. 1 and 2.

These signals are shown in FIG. 3. In this drawing, signal A which appears on output 10 may be represented by the formula:

$$V \sin = V_o \sin Nft \qquad (1)$$

and signal B may be represented by the formula:

$$V \cos = V_o \cos Nft \qquad (2)$$

where:
V sin is the instantaneous magnitude of signal A;
V cos is the instantaneous magnitude of signal B;
$V_o$ is the amplitude of signals A and B;
N is the number of lines on the grating 34;
f is the angular velocity of the shaft 4;
t is time.

The derivative of signal B:

$$(dV\cos/dt) = -V_o Nf \sin Nft \qquad (3)$$

Dividing formula 3 by formula 1:

$$(dV\cos/dt)/V\sin = -Nf \qquad (4)$$

and similarly $$(dV\sin/dt)/V\cos = Nf \qquad (4a)$$

From Formula (4), it can be seen that dividing the derivative of signal B at a particular time by the magnitude of signal A at the same time, a value proportional to the frequency Nf of signals A and B and therefore proportional to the angular velocity of the shaft 4 can be obtained. Also, it can be seen from Formula (4a) that dividing the derivative of signal A at a particular instant by the magnitude of signal B at the same instant will also produce a value proportional to the frequency Nf, but of opposite sign to the value obtained from Formula (4), and therefore proportional to the angular velocity of the shaft 4. In order to obtain this value, the microprocessor 18 performs these calculations.

Thus, by way of example, if a and c are the instantaneous values of signal A at times $t_1$ and $t_3$ shown in FIG. 3 and b and d are the instantaneous values of signal B at times $t_2$ and $t_4$ and times $t_1$ to $t_4$ are equally spaced apart by an interval T, then the derivative of signal A at time $t_2$:

$$(dV\sin/dt) = (c-a)/2T \qquad (5)$$

and the derivative of signal B at time $t_3$ is $$(dV\cos/dt) = (d-b)/2T \qquad (6)$$

From the above,
At time $t_2$, $$f \alpha \frac{c-a}{2T} \cdot \frac{1}{b} \qquad (7)$$

At time $t_3$, $$f \alpha \frac{b-d}{2T} \cdot \frac{1}{c} \qquad (8)$$

Thus, the microprocessor 18 stores alternately the instantaneous values of the waves A and B at successive instants $t_1$, $t_2$ etc. which instants are spaced apart by an interval T which is determined by the microprocessor. From the stored quantities, the microprocessor 18 computes Formula 7 or Formula 8 to obtain a value proportional to frequency and therefore proportional to the angular velocity f of shaft or spindle 4.

When signal A is at its peak value, its derivative is zero and the instantaneous magnitude of signal B is also zero at this time. Similarly, when signal B is at its peak value, its derivative is zero and the instantaneous value of signal A is zero at the same time. Therefore, Formula 7 cannot be used when signal A is at its peak value and Formula 8 cannot be used when signal B is at its peak value. Thus, to ensure that velocity information is computed without a break, microprocessor 18 switches between computing in accordance with Formula 7 and computing in accordance with Formula 8. This switching is achieved by comparing the instantaneous values of the two signals and selecting between Formulae 7 and 8 according to which of the two signals has the greater instantaneous magnitude. Thus, in the illustrated example, the quantity b is compared with the quantity c. Formula 7 is selected if the magnitude of b is greater than that of c and Formula 8 is selected if the magnitude of c is greater than that of b.

Figure 4:
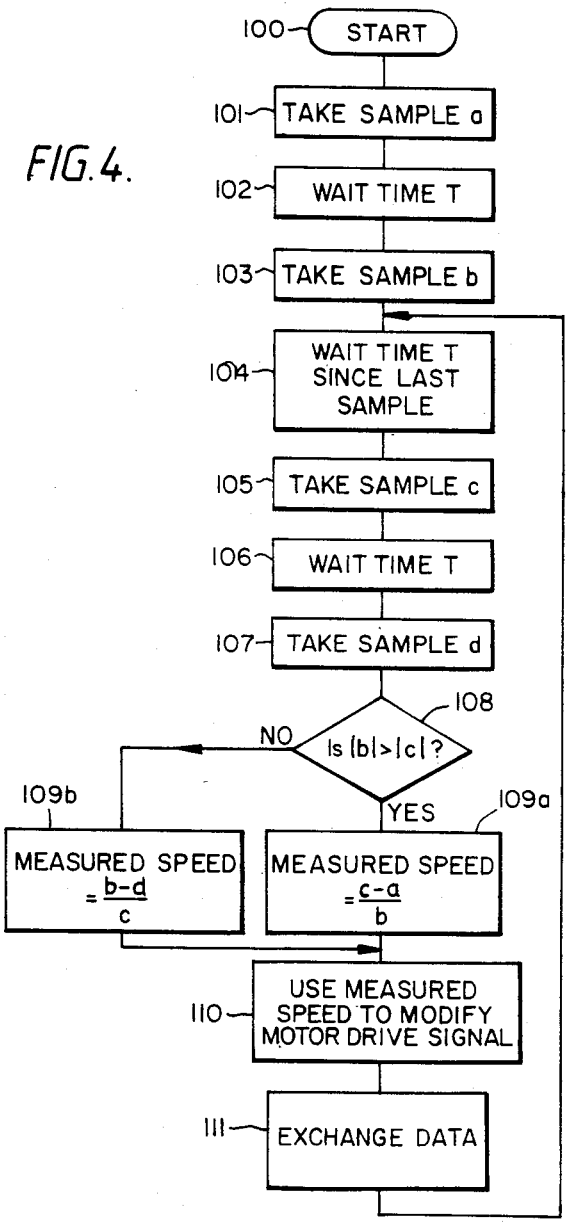
FIG. 4 is a flow chart illustrating the operation of the apparatus illustrated in FIGS. 1 and 2.

The program stored in ROM 20 in accordance with which microprocessor 18 computes Formulae 7 and 8 is illustrated in the flow chart of FIG. 4. The program starts at 100. At step 101, the magnitude of signal A is sampled and stored to obtain value a. The system waits for a time interval T as shown at 102 and then samples signal B at 103 to obtain the quantity b. The system waits for a further interval T as shown at 104 and then samples signal A to obtain quantity c as shown at 105, waits an interval T as shown at 106 and then again samples signal B as shown at 107 to obtain the quantity d. At 108, a determination is made as to whether the magnitude of quantity b is greater than that of quantity c. If it is, Formula 7 is computed as indicated at 109a, and if not, Formula 8 is computed as indicated at 109b. It can be seen in FIG. 4 that the calculations made at 109a and 109b ignore the quantity 2T in the denominators of Formulae 7 and 8 since this quantity is constant.

At 110, the value obtained at 109a or 109b, which value represents the angular velocity of shaft 4, is compared to the required angular velocity and using the difference so obtained, a corresponding correction signal is added to the digitial signal applied to the digital-to-analog converter 26 so that the speed of the motor 6 is increased or decreased as necessary. At the exchange data stage 111, previous samples a and b are discarded and replaced by the samples c and d which become the new values for a and b and the program returns to step 104 to obtain new values for the quantities c and d. Thus, carrying out the exchange data step as indicated at 111 in FIG. 4 makes it possible to calculate velocity after every second sampling operation.

SECOND EMBODIMENT

Figure 5:
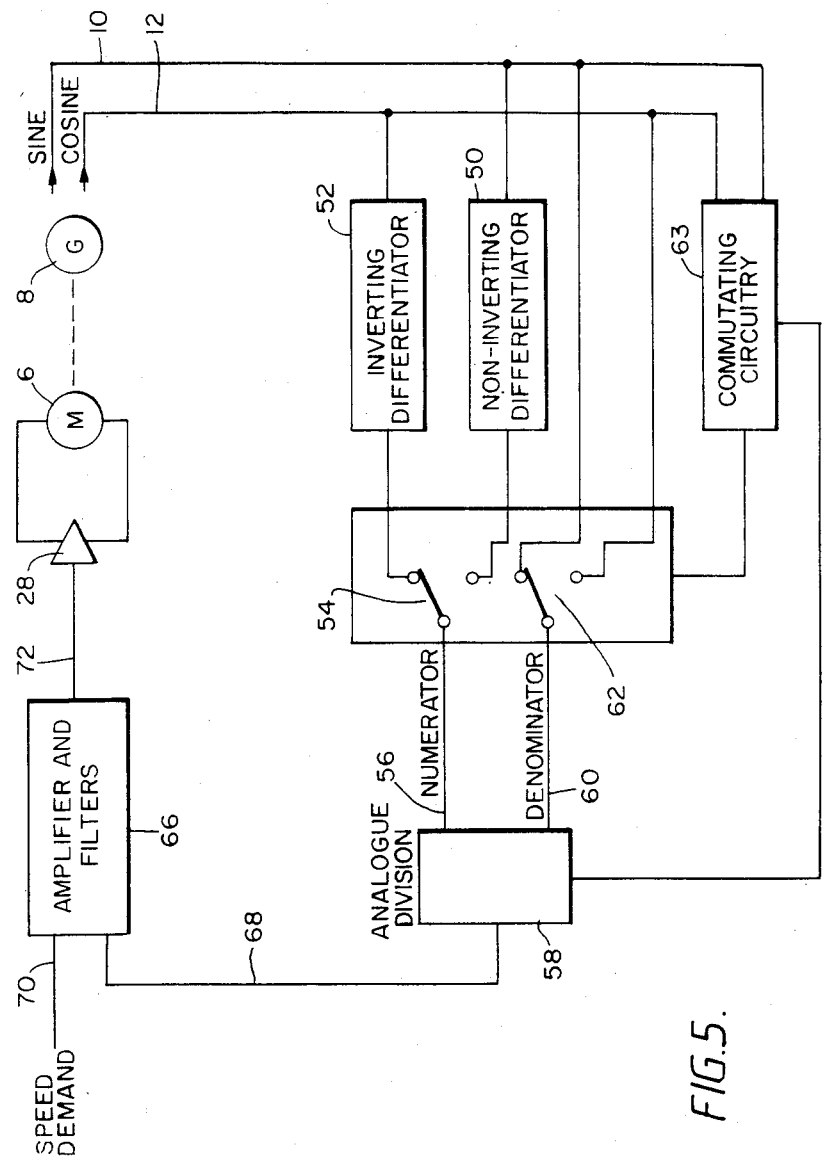
FIG. 5 is a block diagram showing an alternative embodiment of the invention.

FIG. 5 illustrates an alternative embodiment of the invention. In FIG. 5, parts which correspond to parts shown in FIG. 1 are indicated by the same reference numerals.

The FIG. 5 embodiment utilizes analog circuitry instead of the digital circuitry of FIG. 1. The sine and cosine signals A and B output on lines 10 and 12 by transducer arrangement 8 are supplied respectively to non-inverting and inverting analog differentiator circuits 50 and 52. The output of one or other of the circuits 50 and 52 is supplied via a selector switch 54 to the numerator input 56 of an analog division circuit 58. The denominator input 60 of the circuit 58 receives either signal A or signal B through a further selector switch 62. A commutating circuit 63 also receives signals A and B and controls switches 54 and 62 and analog division circuit 58 so that circuit 58 computes a signal proportional to f in accordance with Formula (4) or Formula (4a). The positions of switches 54 and 62 determine which formula is used, and this determination is controlled by circuit 63 so as to avoid applying zero values to the inputs 56 and 60 at times when one of the signals A and B is at its peak value and the other at its zero value, as discussed above.

The output of circuit 58 is supplied to an amplifier and filtering circuit 66 via line 68, which circuit 66 also receives a speed demand signal on a line 70. The circuit 66 compares the signals on line 68 and 70 and outputs an appropriate signal on line 72 for controlling the speed of motor 6 via power amplifier 28.

MODIFICATIONS

Various modifications are possible within the scope of the invention. For example, although the invention has been described in relation to the measurement of angular velocity, it can also be utilized for measuring linear velocity. Although, in the embodiments described, provision has been made for switching between Formulae 4 and 4a or 7 and 8, it would be possible to but the invention into practice without providing for such switching, in which case means may be provided for avoiding the introduction of errors due to the fact that the numerator and denominator of the selected formula become zero once during each cycle. For example, such errors may be avoided by discontinuing the calculation for a short period at these times.

Although one of the embodiments illustrated has involved a programmed micro-computer for putting the invention into practice and the other has involved an analog computer, it is also possible to put the invention into practice by other means, such as hard wired digital circuitry.

Although in the embodiments illustrated continuous sine and cosine signals have been produced, it should be understood that where the velocity does not have to be measured or monitored continuously, it is not necessary to produce continuous quadrature waves. All that is necessary is to produce the appropriate portion of each of the quadrature signals at the time when computation of the velocity is to be carried out. The reference to first and second signals in quadrature in the following claims should be construed accordingly. As an alternative, where it is only necessary to compute the velocity intermittently, the quadrature waves could be produced continuously, but sampling need only take place at the instants when the velocity has to be computed.

The division described above, of a derivative of one signal by the magnitude of the other, may be performed in a variety of different ways. For example, it is possible to perform this division by multiplying the numerator by the reciprocal of the denominator and such reciprocal may, for example, be obtained from a look-up table. The work "division" and the "dividing" should be construed accordingly.

Although in the illustrated embodiments the velocity of a rotary shaft has been measured relative to a stationary member, it is possible to employ the invention to measure the relative velocity of two components. If the two components are mounted on the same axis, then mounting the grating on one component and the transducer head on the other is the easiest way of measuring the relative velocity. This will not often be available though. An alternative is to provide the two components with their own separate grating and transducer arrangement where the outputs associated with component 1 are:

$$V \sin_1 = V_o \sin N_1 f_1 t$$

$$V \cos_1 = V_o \cos N_1 f_1 t$$

and similarly those for component 2 are:

$$V \sin_2 = V_o \sin N_2 f_2 t$$

$$V \cos_2 = V_o \cos N_2 f_2 t$$

These signals may be taken and processed using the trigonometric identities:

$$\sin(A-B) = \sin A \cos B - \cos A \sin B$$

$$\cos(A-B) = \cos A \cos B + \sin A \sin B$$

to form the composite signals:

$$\begin{aligned} V\sin_3 &= V\sin_1 \cdot V\cos_2 - V\cos_1 \cdot V\sin_2 \\ &= V_o^2 \sin(N_1 f_1 - N_2 f_2) t \\ V\cos_3 &= V\cos_1 \cdot V\cos_2 + V\sin_1 \cdot V\sin_2 \\ &= V_o^2 \cos(N_1 f_1 - N_2 f_2) t \end{aligned}$$

where $V \sin_3$ and $V \cos_3$ are, or represent, quadrature signals whose frequency represents the difference in velocity between the two components.

Forming the differentials (derivatives) and dividing them as in formulae (4) and (4a) above gives a measure of the relative speeds as follows:

$$(dV \sin_3/dt)/V_{\cos_3} = N_1 f_1 - N_2 f_2$$

and $$-(dV_{\cos_3}/dt)/V \sin_3 = N_1 f_1 - N_2 f_2$$

When used in a control loop, the error signal is zero when $N_1 f_1 = N_2 f_2$, i.e. the speed $f_1$ and $f_2$ are in the ratio of $N_2:N_1$. For the more usual case of $N_1 = N_2$, the zero error condition relates to equal speeds on both components. Thus, the term "velocity" in the claims includes "relative velocity".

Although the invention has been described so far in relation to input signals in quadrature, it is possible to compensate, within the scope of the invention, for phase errors in the quadrature relationship. Any such phase error will cause a ripple (of predictable form) to appear on the output, i.e. the "velocity" signal. If the phasing error is known, for example from automatic measurement in the microprocessor of the preferred embodiment, then the effect of the phasing error could be taken out by adjusting the times between samples to effectively sample at the correct points. For instance, if the cosine signal is out of quadrature by $+5°$, the time between sine and cosine samples would be adjusted by the time taken to traverse $5°$ at that particular nominal speed, and the time between the cosine and sine samples would be adjusted by the + the time taken to traverse $5°$ at that particular nominal speed. Thus, the time between samples on the same channel remains constant, but the time between consecutive sampling points is adjusted to accommodate this phase error. The limitation would come at the low frequency end of the range where the necessary times would cause the sampling points to go out of the normal sequence.

The invention may also be applied to situations in which the two input signals are substantially out of quadrature. In this case the non-quadrature input signals are used to generate signals substantially in quadrature and these latter signals are used as the input signals of the invention. The generation of the quadrature signals may be done internally or externally to the microprocessor but would require the addition of extra circuitry. The input signals should have a quadrature component and this is then extracted by adding the two inputs together in a ratio dependent upon the input signal phases. For example, if $\phi$ is the phase error, then the input signals may be defined as $$V_1 = V_o \sin\{(2\pi x/x_o) + (\phi/2)\}$$

$$V_2 = V_o \cos\{(2\pi x/x_o) - (\phi/2)\}$$

After some manipulation, it may be shown that $$V_{sin} = (V_1 - a_{sin} V_2) b_{sin} = V_o \sin(2\pi x/x_o)$$

$$V_{cos} = (v_1 - a_{cos} V_2) b_{cos} = V_o \cos(2\pi x/x_o)$$

where $$a_{sin} = \tan \phi/2$$

$$b_{sin} = 1/\{\cos \phi/2 - (\tan \phi/2 \sin \phi/2)\}$$

$$a_{cos} = \cot h \, \phi/2$$

$$b_{cos} = 1/\{\cos \phi/2 - (\cot h \, \phi/2 \sin \phi/2)\}$$

Thus, the quadrature signals may be derived from the non-quadrature input signals if the phasing error is known.

I claim:

1. Apparatus for measuring velocity of members in a high precision apparatus, comprising:
    an optical grating fixed relative to a first member;
    transducer means fixed relative to a second member and arranged for receiving light from said optical grating so as to produce two signals which have magnitudes, which are substantially in quadrature with one another, and which have a frequency dependent upon velocity of said first and second members relative to one another; and
    calculation means coupled to said transducer means for receiving said two signals as input signals to the calculation means, said calculation means including means for providing a first value dependent upon a derivative of a first of said input signals and a second value dependent upon the magnitude of the second of said input signals, said calculation means further including means for dividing one of said values by the other value to obtain a third value which represents said velocity.

2. Apparatus according to claim 1 wherein said calculation means includes digital processor means programmed to divide said one value by the other to obtain said third value.

3. Apparatus according to claim 2, wherein said digital processor means is programmed to obtain said first value by obtaining a difference between the magnitudes of said first signal at spaced apart times.

4. Apparatus according to claim 2, comprising means for receiving said input signals in analog form, and analog-to-digital converter means for converting said signals to digital form for supply to said digital processor means.

5. Apparatus according to claim 4 comprising sampling means for sampling said input signals alternately, said digital processor means being programmed to obtain, for a group of three successive samples, a difference between the first and third ones of said successive samples in order to obtain said first value and to utilize the second one of said successive samples for said second value.

6. Apparatus according to claim 5, wherein said digital processor means is programmed to utilize, as the first sample in each said group other than the first said group, the third sample of the preceding said group.

7. Apparatus according to claim 5, wherein said sampling means comprises analog switch means for supplying said input signals alternately to said analog-to-digital converter means.

8. Apparatus according to claim 2, wherein said digital processor means is programmed to utilize, at times when one input signal is at its peak and the other signal is at zero, the signal which is at its peak as the second signal and the signal which is at zero as the first signal.

9. Apparatus according to claim 8, wherein the digital processor means is programmed to utilize each input signal as said first signal and said second signal alternately.

10. Apparatus according to claim 9, wherein said digital processor means is programmed to determine which input signal has a smaller instantaneous magnitude and to utilize that signal as the first signal.

11. Apparatus according to claim 2, wherein said digital processor means is programmed to obtain said third value repeatedly during each cycle of said signals.

12. Apparatus according to claim 1, comprising an analog computer arranged for obtaining said first, second and third values.

13. Apparatus according to claim 12, wherein said analog computer includes means responsive to said input signals to cause said analog computer to obtain said third value, at times when one input signal is at a peak and the other signal at zero, by utilizing a derivative of the input signal at zero and the magnitude of the input signal at its peak.

14. Apparatus according to claim 1, wherein said dividing means is arranged for dividing said first value by said second value.

15. Apparatus according to claim 1, wherein said transducer means includes means for producing said two signals with a frequency dependent upon angular velocity of one of said members relative to the other one of said members.

16. Apparatus according to claim 1, wherein said transducer means includes means for producing said two signals with a frequency dependent upon linear velocity of one of said members relative to the other one of said members.

17. Apparatus according to claim 1 in combination with means responsive to said third value for controlling said velocity.

18. Apparatus according to claim 1, wherein the frequency of said signals is not more than 200 Hz.

19. Apparatus according to claim 1, wherein the frequency of said signals is not more than 1 kHz.

20. Apparatus according to claim 1, wherein said input signals are un-normalized and said calculation means operates without normalizing said input signals.

21. Apparatus for measuring relative velocity of members, in a high precision apparatus comprising:
- means for producing a first pair of preliminary signals substantially in quadrature with one another having a frequency dependent upon velocity of a first movable member relative to a stationary member;
- means for producing a second pair of preliminary signals substantially in quadrature with one another having a frequency dependent upon velocity of a second movable member relative to a stationary member;
- means for processing said first and second pairs of preliminary signals to derive therefrom two input signals which have magnitudes, which are substantially in quadrature with one another, which have a frequency dependent upon relative velocity of said first and second movable members; and
- means for providing a first value dependent upon a derivative of a first of said input signals, means for providing a second value dependent upon the magnitude of the second of said input signals, and means for dividing one of said values by the other value to obtain a third value which is representative of relative velocity of said first and second movable members.

* * * * *